United States Patent
Quader et al.

(10) Patent No.: US 7,379,346 B2
(45) Date of Patent: *May 27, 2008

(54) ERASE INHIBIT IN NON-VOLATILE MEMORIES

(75) Inventors: Khandker N. Quader, Sunnyvale, CA (US); Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/223,055

(22) Filed: Sep. 8, 2005

(65) Prior Publication Data

US 2006/0028876 A1    Feb. 9, 2006

Related U.S. Application Data

(63) Continuation of application No. 10/671,847, filed on Sep. 25, 2003, now Pat. No. 6,958,936.

(51) Int. Cl.
*G11C 11/03* (2006.01)

(52) U.S. Cl. ................ 365/185.29; 365/185.17; 365/185.18; 365/185.25

(58) Field of Classification Search ........... 365/185.29, 365/185.17, 185.18, 185.25
See application file for complete search history.

(56) References Cited

U.S. PATENT DOCUMENTS

| | | | |
|---|---|---|---|
| 6,373,746 B1 | 4/2002 | Takeuchi et al. | |
| 6,442,080 B2 | 8/2002 | Tanzawa et al. | |
| 6,522,580 B2 | 2/2003 | Chen et al. | |
| 6,958,936 B2 * | 10/2005 | Quader et al. | 365/185.17 |
| 2002/0167844 A1 | 11/2002 | Han et al. | |

FOREIGN PATENT DOCUMENTS

EP    1 271 553 A2    1/2003

OTHER PUBLICATIONS

Examiner's Report for European Patent Application No. 04 788 913.4 for SanDisk Corporation, dated Aug. 10, 2006, 3 pages.
International Search Report, International Application No. PCT/US2004/031082, mailed Jan. 28, 2005, 3 pages.
Written Opinion of the International Searching Authority, International Application No. PCT/US2004/031082, mailed Jan. 28, 2005, 6 pages.

* cited by examiner

*Primary Examiner*—Pho M. Luu
(74) *Attorney, Agent, or Firm*—Davis Wright Tremaine LLP

(57) ABSTRACT

A non-volatile memory and method for its operation that can reduce the amount of disturb in non-selected cells during an erase process are presented. For a set of storage elements formed over a common well structure, all word-lines are initially charged with the same high voltage erase signal that charges the well to insure there is no net voltage difference between the well and word-lines. The selected word-lines are then discharged to ground while the non-selected word-lines and the well are maintained at the high voltage. This can be accomplished without increasing any pitch area circuit or adding new wires in the memory array, and at minimal additional peripheral area. Advantages include less potential erase disturb in the non-selected storage elements and a tighter erase distribution for the selected elements.

11 Claims, 6 Drawing Sheets

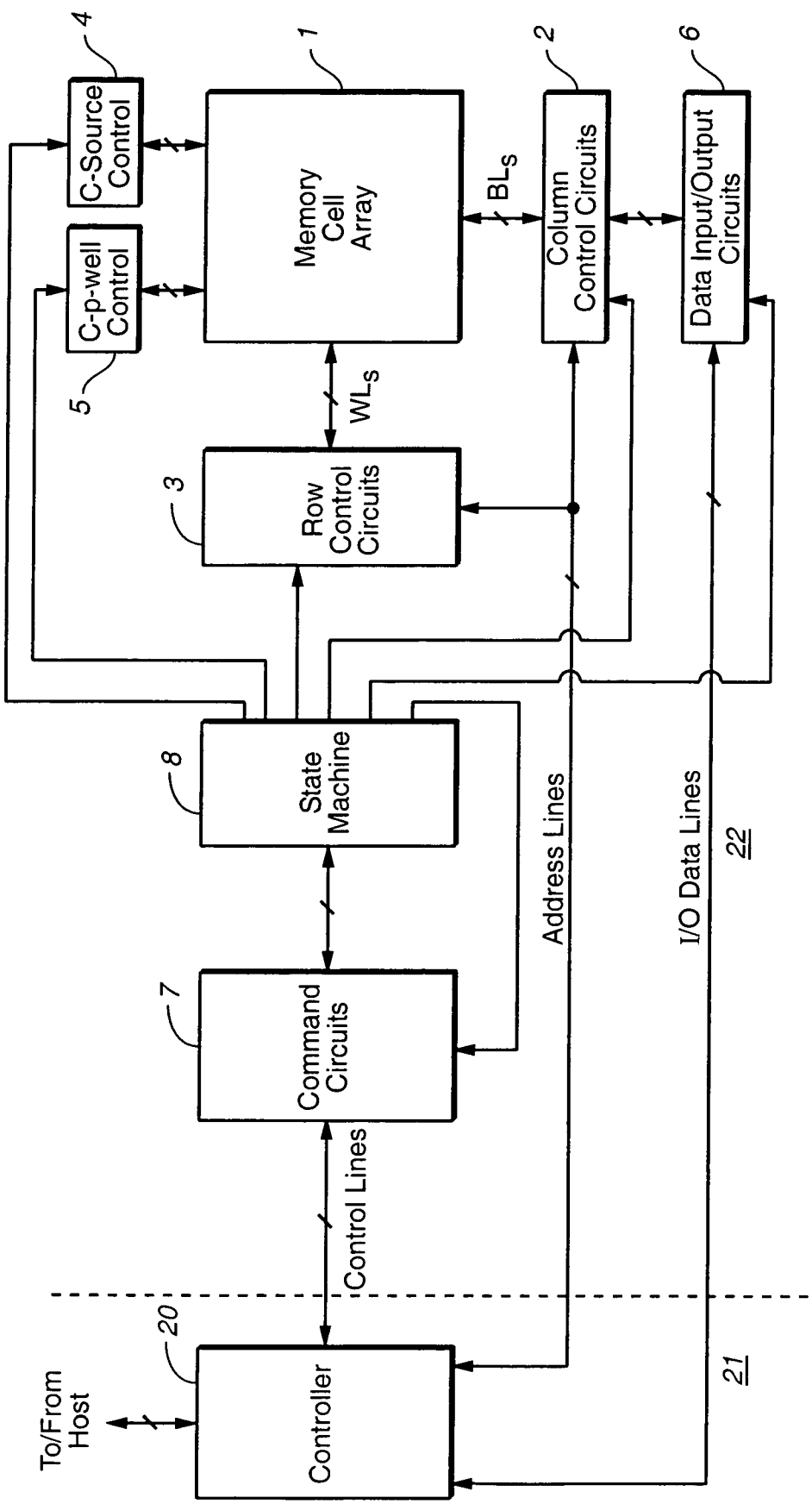
FIG._1

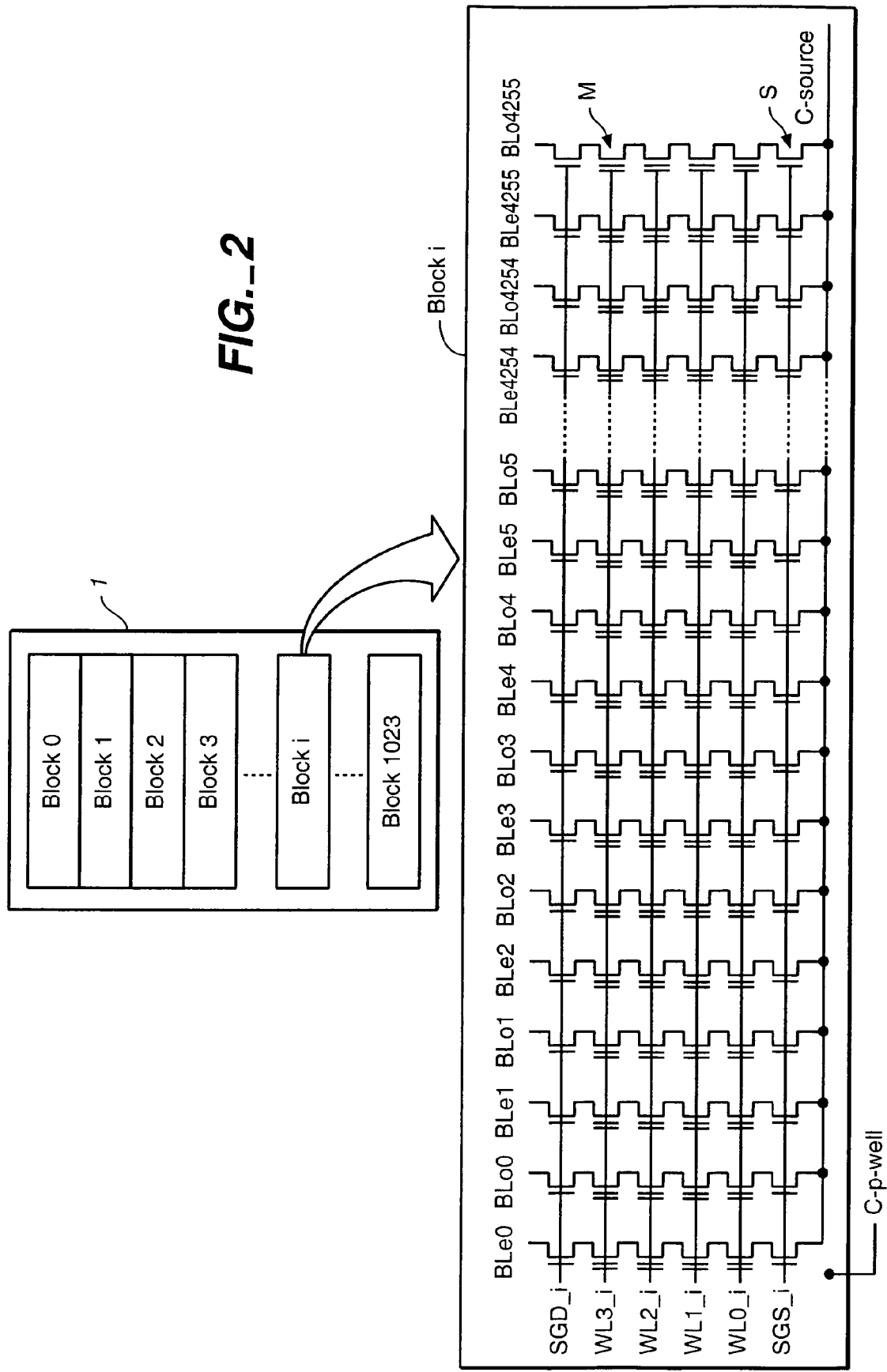
FIG._2

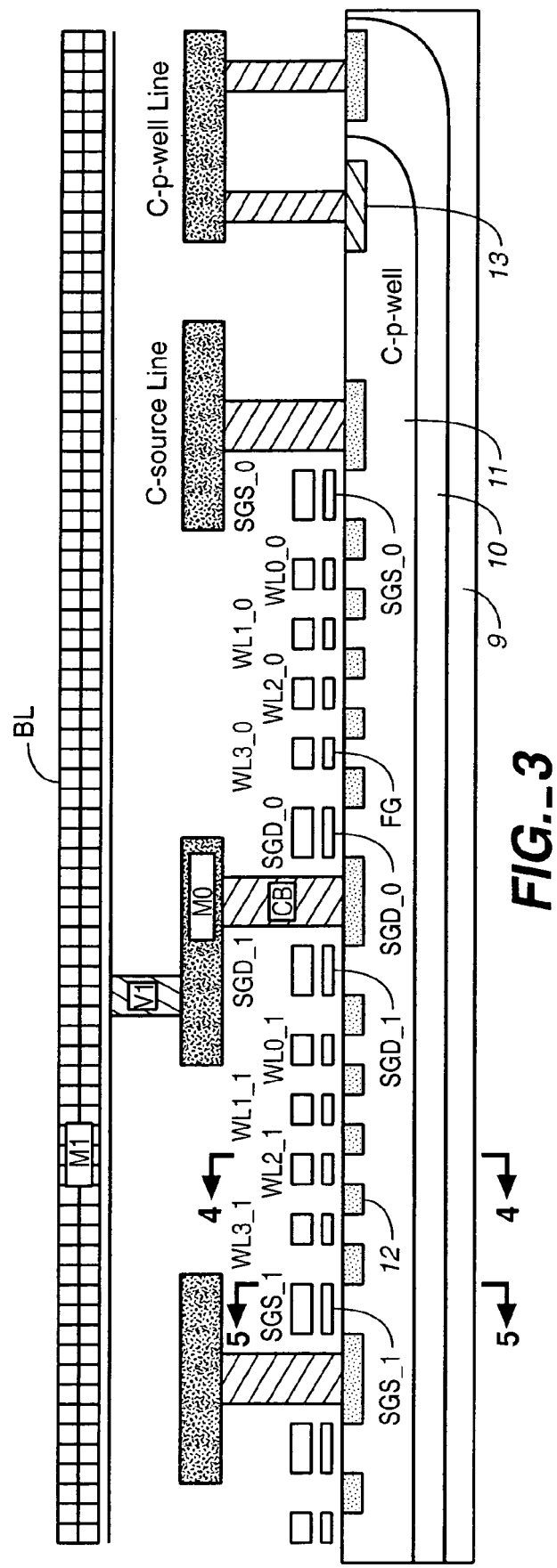
FIG._3

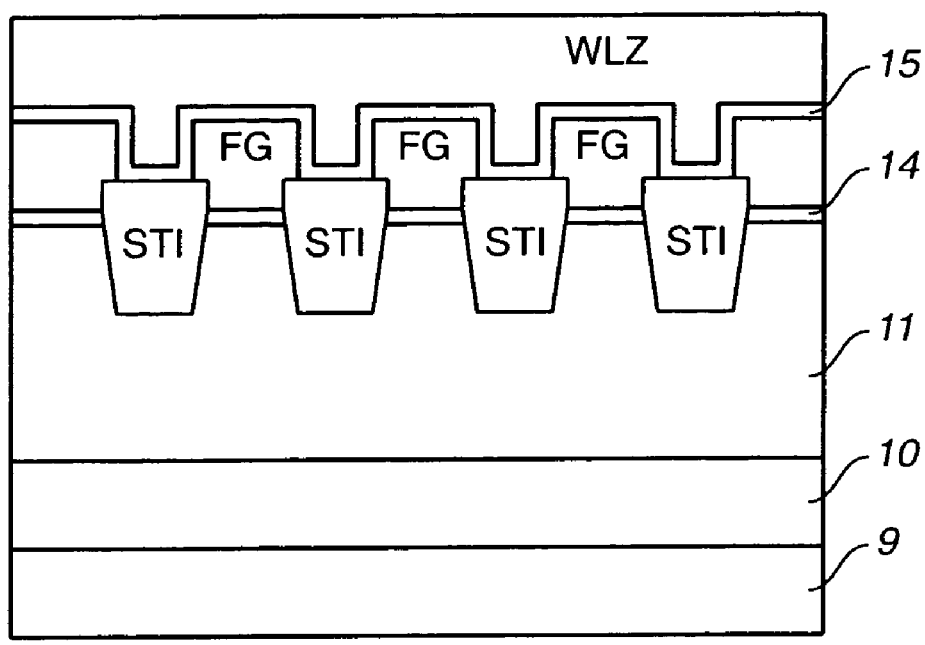
FIG._4
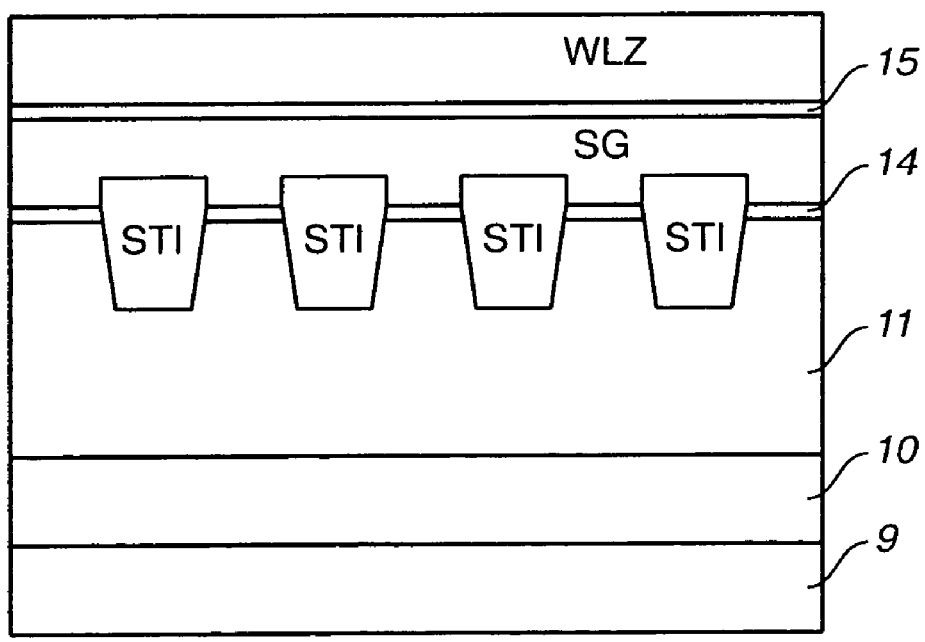
FIG._5

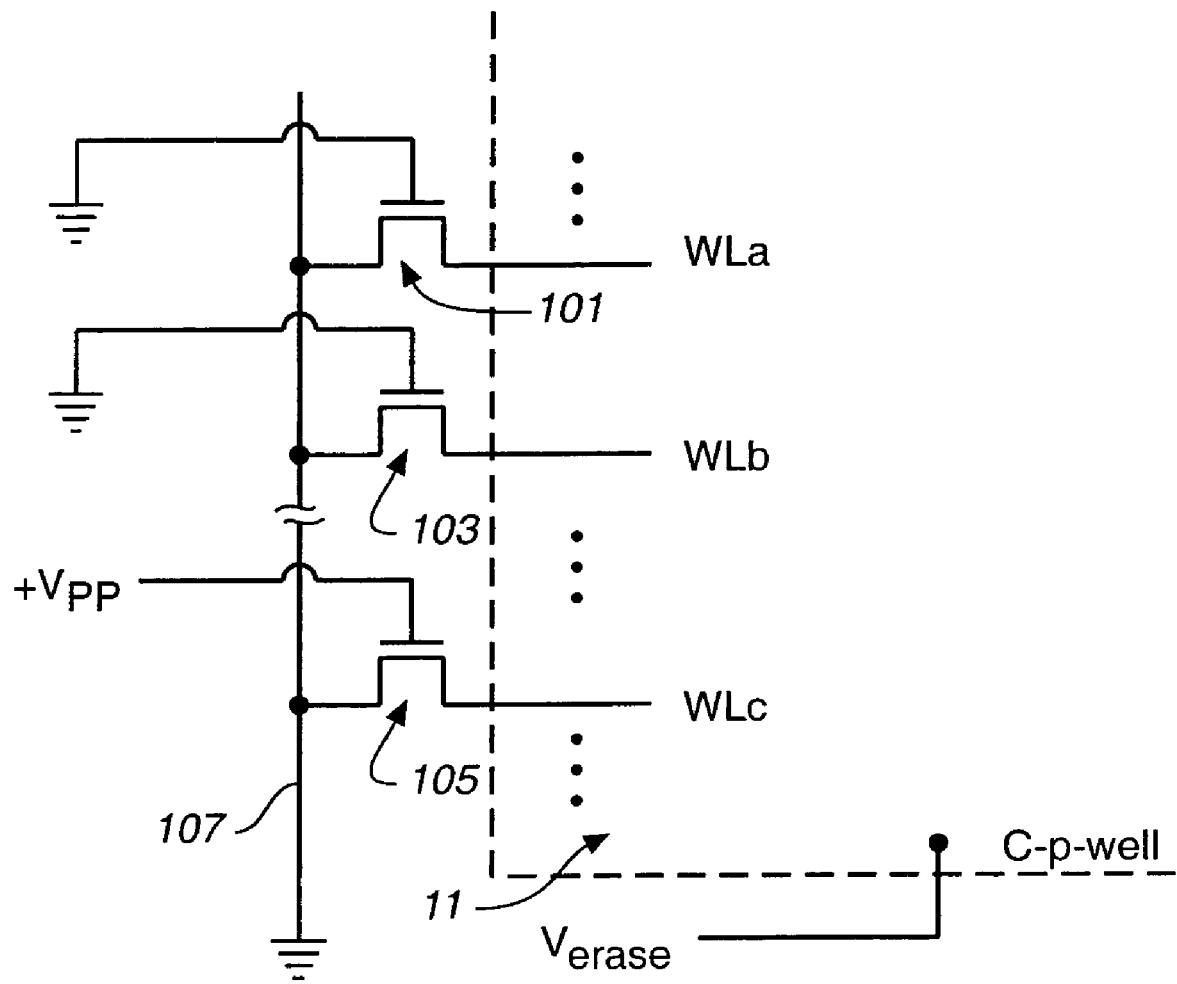
FIG._6

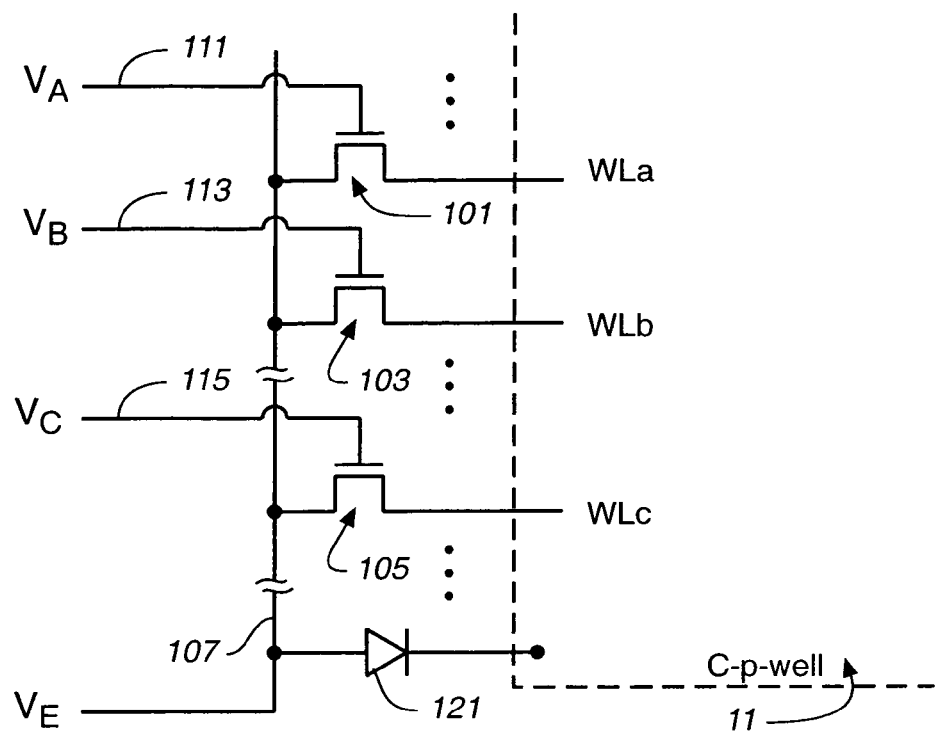
FIG._7A
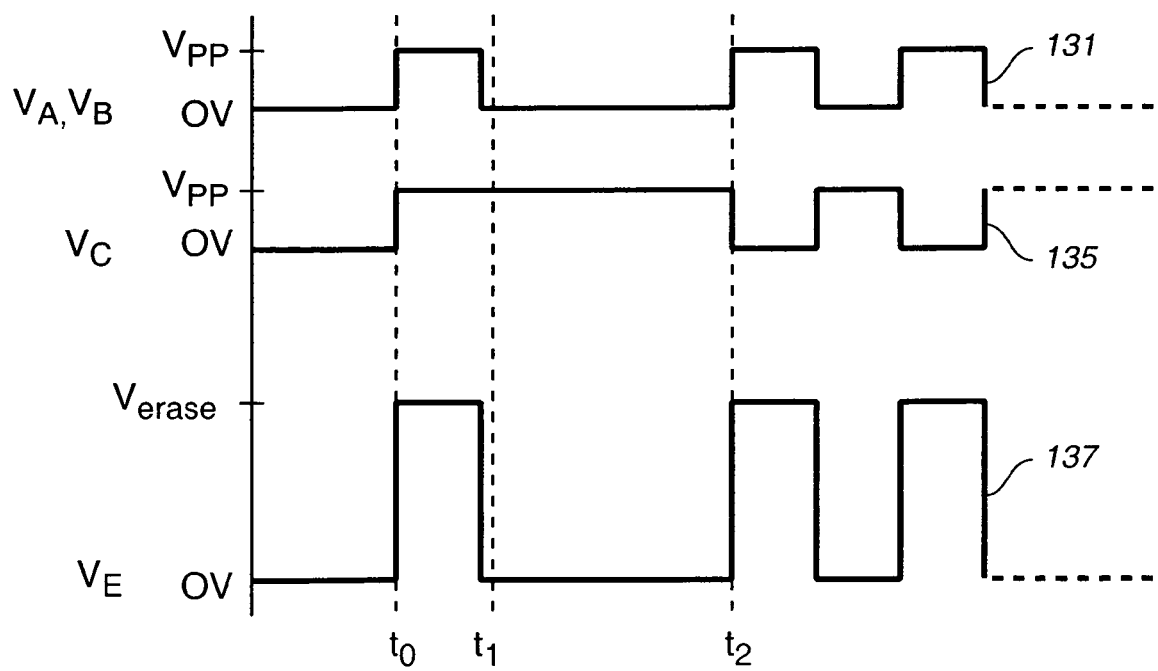
FIG._7B

ERASE INHIBIT IN NON-VOLATILE MEMORIES

CROSS-REFERENCE TO RELATED APPLICATIONS

This application is continuation of application Ser. No. 10/671,847, filed on Sep. 25, 2003, now U.S. Pat. No. 6,958,936 which is hereby incorporated by this reference.

FIELD OF THE INVENTION

This invention relates generally to a non-volatile memory and its operation, and, more specifically, to techniques for insuring controlled erase conditions.

BACKGROUND OF THE INVENTION

The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates.

During the operation of a non-volatile memory, the reading, writing, and erase of data in one storage unit will often disturb the data stored in other storage units of the memory. One source of these disturbs is the field effect coupling between adjacent floating gates as described in U.S. Pat. No. 5,867,429 of Jian Chen and Yupin Fong, which patent is incorporated herein in its entirety by this reference. Additional techniques for reducing such disturbs are described in U.S. Pat. No. 6,522,580, which is incorporated herein in its entirety by this reference.

This effect and other sources of read and write disturbs are present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in U.S. Pat. No. 6,522,580, incorporated by reference above. Other examples are given in U.S. patent applications entitled "Highly Compact Non-Volatile Memory and Method Thereof", by Raul-Adrian Cernea, and "Non-Volatile Memory and Method with Reduced Source Line Bias Errors", by Raul-Adrian Cemea and Yan Li, both filed Sep. 24, 2002, and in U.S. Pat. Nos. 5,546,341, 5,473,563 and 6,373,746, all hereby incorporated by this reference.

It is still most common in current commercial products for each floating gate to store a single bit of data by operating in a binary mode, where only two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate) now being included in commercial products. More storage states, such as 16 states per storage element, are contemplated. Each floating gate transistor has a certain total range (window) of threshold voltages in which it may practically be operated, and that range is divided into the number of states defined for it plus margins between the states to allow them to be clearly differentiated from one another. In a multi-state nonvolatile memory, the threshold voltage ranges are often increased in comparison with single-bit memories in order to accommodate the all of the multi-states and their margins. Correspondingly, the voltages applied to the control gates during read and programming are correspondingly increased, resulting in more erase, program, and read disturbs. Additionally, as devices move to lower power designs, the available window in which to fit these multi-states is also shrinking further aggravating the problems.

A common operation of these types of non-volatile memories is to erase blocks of memory cells prior to reprogramming them. The cells within the block are then individually programmed out of erase into states represented by the incoming data being stored. Programming typically includes alternate application to a large number of memory cells in parallel of programming voltage pulses and a reading of their individual states to determine whether the individual cells have reached their intended levels. Programming is stopped for any cell that is verified to have reached its intended threshold level while programming of the other cells being programmed in parallel continues until all of those cells are programmed. When the number of storage states per storage element is increased, the time to perform the programming will usually be increased since the smaller voltage ranges for the individual states requires a greater precision of programming. This can have a significant adverse impact on the performance of the memory systems.

The narrower ranges of the defined floating gate storage levels that result from multi-state operation increases the level of sensitivity of a first group of storage elements to operations performed on a second group of adjacent storage elements. In an erase operation, the storage elements are typically subjected to a large voltage differential in order to remove charge from the floating gate. As non-selected storage elements are often also subjected to high voltage values, through shared word lines, bit lines, well structures, capacitive couplings, or other mechanisms, this can lead to disturbs on the non-selected storage elements. For example, in a NAND structure such as that described in U.S. Pat. No. 6,522,580, incorporated by reference above, a high voltage differential is created across selected storage elements by placing their erase gates at ground and raising the well structure of the array to a high erase voltage. Non-selected storage elements may also be upon this well structure. Although it is common in the prior art to allow unselected erase gates to be charged by capacitive couplings from the well (as is described, for example, in U.S. Pat. No. 5,546,341 incorporated above), there will still be a potential placed across the storage element that can lead to disturbs. If the number of erroneous bits is maintained within the capability of an error correction code (ECC), the errors are corrected but if the number of errors is typically larger than that, some other structural and/or operating technique(s) needs to be employed. It is desired to provide techniques to reduce erase disturbs in non-volatile memories to further increase their performance.

SUMMARY OF THE INVENTION

The present invention presents a non-volatile memory and method for its operation that can reduce the amount of disturb in non-selected cells during an erase process. For a set of storage elements formed over a common well structure, all word-lines are initially charged with the same high voltage erase signal that charges the well to insure there is no net voltage difference between the well and word-lines. The selected word-lines are then discharged to ground while the non-selected word-lines and the well are maintained at the high voltage. As an option, during the erase cycle the inhibited storage elements may be periodically refreshed to the well potential (high voltage) and/or the selected word-lines can be floated and/or periodically refreshed to ground.

In an exemplary embodiment, a flash memory with a NAND architecture is used. A large number of blocks, the unit of erase, are formed upon a single well structure. Each block contains a number of words lines to which the control gates of the memory units are connected. The control gates of the memory units over the well are charged to the erase voltage at the same time as the well itself. The charge is then trapped on the word lines of the non-selected blocks during the erase process, thereby setting the same voltage level on both the control gates and the well so that no potential is placed across the charge storing element. In a selected block, the word lines are discharged, setting up a voltage difference across the floating gate and leading to its erase.

According to another aspect of the present invention, this can be accomplished without increasing any pitch area circuit or adding new wires in the memory array, and at minimal additional peripheral area. By appropriate changes to the decoding on the memory device, the structure within the array portion of the memory device can be maintained while allowing the non-selected word lines to be held at a voltage above that which would be obtained through capacitative coupling to the substrate alone. Advantages include less potential erase disturb in the non-selected storage elements and a tighter erase distribution for the selected elements.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIG. 2 illustrates an existing circuit and organization of the memory array of FIG. 1 when a NAND type;

FIG. 3 shows a cross-sectional view, along a column, of a NAND type of memory array formed on a semiconductor substrate;

FIG. 4 is a cross-sectional view of the memory array of FIG. 3, taken at section 4-4 thereof;

FIG. 5 is a cross-sectional view of the memory array of FIG. 3, taken at section 5-5 thereof;

FIG. 6 schematically illustrates a prior art erase arrangement; and

FIGS. 7*a* and 7*b* show aspects of an exemplary embodiment of the present invention.

DESCRIPTION OF EXEMPLARY EMBODIMENTS

Example Non-Volatile Memory System

With reference to FIGS. 1-7, a specific non-volatile memory system is described in which the various aspects of the present invention are implemented, in order to provide specific examples. To reduce the amount of disturb in erase processes, the present invention maintains the control gates of non-selected storage elements at the same voltage level as their underlying well structure. In a exemplary embodiment, the storage elements are formed over a well structure. During an erase process, both the selected and non-selected storage elements over the well are raised to an erase voltage concurrently with establishing this voltage level in the well. This voltage is then held on the well and the non-selected storage elements, thereby reducing the chance of any erase related disturbs, while the selected storage elements are allowed to discharge, producing the needed erase conditions. Further, this can be accomplished without increasing any pitch area of circuit or adding new wires in the memory array, resulting in minimal additional peripheral area being added to the circuit.

For specificity, the present invention is described for an EEPROM flash memory of the NAND type, although generalizations will be discussed further below. In particular, the present exposition will use the sort of system described in U.S. Pat. No. 6,522,580 and the other applications related to NAND systems that are incorporated by reference above. When specific voltages are needed in the following, the erase voltage $V_{erase}$ is taken to be in the 15-20 volt range, the low logic level is taken as ground, and the high logic level $V_{dd}$ taken in the 1.5-3 volt range, although other values can be used, depending on design.

FIG. 1 is a block diagram of a flash memory system. Memory cell array 1 including a plurality of storage units M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of p-type regions (labeled as "c-p-well" 11 in FIG. 3) on which the memory cells (M) are formed. The c-source control circuit 4 controls the common source lines (labeled as "c-source" in FIG. 2) connected to the memory cells (M). The c-p-well control circuit 5 controls the voltage of the c-p-well.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20. Command data for controlling the flash memory device are input to a command interface connected to external control lines, which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. The host initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 2, an example structure of the memory cell array 1 is described. A flash EEPROM of a NAND type is described as an example. The memory cells (M) are partitioned into a number of blocks, 1,024 in a specific example. The data stored in each block are simultaneously erased. The block is thus the minimum unit of a number of cells that are simultaneously erasable. In each block, there are N columns, N=8,512 in this example, that are divided into left columns and right columns, as described in further U.S. Pat. No. 6,522,580. The bit lines are also divided into left bit lines (BLL) and right bit lines (BLR). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first (Drain) select gate line (SGD), and another terminal is connected to the c-source via a second (Source) select transistor (S) which gate electrode is coupled to a second select gate line (SGS). Although four floating gate transistors are shown to be included in each cell unit, for simplicity, other numbers of transistors, such as 8, 16, or even 32, are used. FIG. 2 also includes a connection, C-p-well, for supplying the well voltage.

In each block, in this example, 8,512 columns are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although, for simplicity, four floating gate transistors are shown to be included in each cell unit, a higher number of transistors, such as 8, 16 or even 32, are used.

In an alternate set of embodiments, as described in U.S. patent application Ser. No. 10/086495, filed Feb. 27, 2002, which is hereby incorporated by reference, the array can be divided into left and right portions instead of the odd-even arrangement. The left and right sides may additionally have independent well structures with the right and left sides of the array each formed over such separate well structures, allowing the voltage levels to be set independently by the c-p-well control circuit 5 of FIG. 1. In a further variation, this could also allow erasure of a sub-block of less than all of the partitions of a block. Further variations that are compatible with the present invention are also described in application Ser. No. 10/086495.

In the exemplary embodiments, the page size is 512 bytes, which is smaller than the cell numbers on the same word line. This page size is based on user preference and convention. Allowing the word line size to correspond to more than one page's worth of cells saves the X-decoder (row control circuit 3) space since different pages worth of data can share the decoders. During a user data read and programming operation, N=4,256 cells (M) are simultaneously selected in this example. The cells (M) selected have the same word line (WL), for example WL2, and the same kind of bit line (BL). Therefore, 532 bytes of data can be read or programmed simultaneously. This 532 B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, each of the left and right c-p-wells being enclosed by an n-type region 10 to electrically isolate the c-p-wells from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

The exemplary embodiment uses Flash EEPROM storage units, where each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4-4 of FIG. 3) and a select transistor (section 5-5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). Since the gate electrode (SG) of the select transistor (S) is formed in the same formation process steps as the floating gate (FG) and word line (WL), it shows a stacked gate structure. These two select gate lines (SG) are shunted at the end of lines.

U.S. Pat. No. 6,522,580, that is incorporated by reference above describes the various voltages applied to operate the memory cell array 1, in a specific example, each memory cell's floating gate storing two bits, having one of the states "11", "10", "01", "00". This is reviewed briefly here for the case where the word line "WL2" and the bit lines of "BLe" are selected for erase, reading or programming. By raising the c-p-well to an erase voltage of $V_{erase}$=15-20 V and grounding the word lines (WL) of a selected block, the data of the selected block is erased. Since all of the word lines (WL) of the unselected blocks, bit lines (BL), select lines (SG) and c-source are put in a floating state, these are also raised to almost $V_{erase}$ due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

The high voltage values used in the erase and programming values can be generated from the lower supply values using a charge pump (not shown in FIG. 1). These higher voltage values can either be produced on the memory chip 22 itself, or supplied form another chip in the memory system. The use and location of the high voltage source is discussed more fully in U.S. Pat. No. 6,282,130, which is hereby incorporated by reference, and additional references cited therein.

FIG. 6 schematically illustrates such a prior art arrangement. Three representative word lines, $WL_A$, $WL_B$, and $WL_C$ are connected to a line 107 that supplies the various voltage levels through transistors 101, 103, and 105, respectively. The transistors 101, 103, and 105 together with line 107 would be part of the row control circuit 3 of FIG. 1. The c-p-well control circuit 5 of FIG. 1 provides the voltage for the well structure c-p-well 11. The word lines then continue on over the well structure 11 to any of the various word lines of the different blocks of memory 1 shown in FIG. 2. In a erase process, with word line $WL_C$ corresponding to a selected word line and $WL_A$ and $WL_B$ both non-selected, the voltage in the c-p-well is raised to the erase voltage of, say, 17 volts and line 107 is set to ground. The gate of transistor 105 is set to the high level of $V_{dd}$, taking word line $WL_C$ to ground, while both of transistors 101 and 103 are turned off by setting their gates to ground, leaving $WL_A$ and $WL_B$ to float. This results in the erase conditions described above, where the unselected erase gates are charged by capacitive couplings from the well (as is described, for example, in U.S. Pat. No. 5,546,341 incorporated above) and the selected erase gates are forced to ground. Other aspects of the erase process are described in U.S. patent application Ser. No. 09/956,201, filed Sep. 17, 2001, which is hereby incorporated by reference. In particular, U.S. patent application Ser. No. 09/956,201 describes a process where the non-selected word-lines can be floated, a process which can also be incorporated into alternate embodiments of the various aspects of the present invention.

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to $V_{dd}$ of a power supply, for example 3 V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to $V_{dd}$ of a power supply, for example 3V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V because of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage level specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY 01 operation, the selected word line WL2 is connected to 2.4V, so that it is verified that whether the threshold voltage has reached 2.4V. In this verify case, it can be said that a verify level is 2.4V. Again, for all of the described processes, the recited voltage levels are only exemplary values.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, If the threshold voltage is lower than the read or verify level, the potential level of the concerned bit line (BLe) decreases to a low level, for example less than 0.5V, because of the conductive memory cell (M). Further details of the read and verify operations are explained below.

Examples of New Erase Techniques

In the erase operation described above, the selected word lines are held at ground to provide the desired potential difference between the cells control gate and the erase voltage in the well structure. The non-selected cells depend upon capacitive coupling between their control gates and the well to raise the control gates to a high enough value so that these cells are not erased. Although the capacitive coupling will raise the non-selected word lines, such as $WL_A$ and $WL_B$ in FIG. 6, to near well level, it will not be raised to the full value, causing a potential difference to be set up across the connected cells. This can result in some of the stored charge being lost from the floating gates and eventually resulting in a possible disturb, particularly in low voltage, multi-state devices. In a principle aspect, the present invention raises the voltage level on the non-selected word lines above what would result from the capacitive coupling alone, thereby reducing or eliminating the potential difference between non-selected control gate FIG. 7a is similar to FIG. 6 and shows most of the same elements. The various word line voltages $V_E$ are supplied along line 107. This is received by representative word lines $WL_A$, $WL_B$, and $WL_C$ respectively through transistors 101, 103, and 105, which are in turn controlled by respective voltages $V_A$, $V_B$, and $V_C$ along lines 111, 113, and 115. The word lines in FIGS. 6 and 7a have been labeled $WL_A$, $WL_B$, and $WL_C$. These word lines can correspond to the word lines of the same block in FIG. 2, such as WL0_i, WL1_i and WL2_i, where only WL2_i has been selected for erase, or may be from different blocks where the block containing $WL_C$ has been selected for erase, both those containing $WL_A$ and $WL_B$ have not. FIG. 7a also shows the well structure 11 connected to line 107 through diode 121 to receive the voltage $V_E$ from line 107. This particular arrangement is somewhat specific to a particular embodiment of the present invention where the level $V_E$ corresponds to a voltage that is supplied concurrently to both the well and some of the word lines. More generally, this particular connection is used only when this condition is met and, even in those circumstance, the well voltage can be supplied by the c-p-well control 5 (FIG. 1) as described in the various incorporated references. In any case, for the exemplary embodiment of the present invention, FIG. 7a schematically represents some of the elements from row control circuits 3 (FIG. 1) and the c-p-well control 5 that can supply the voltages represented in FIG. 7b to the appropriate elements.

FIG. 7b is a set of waveforms for the various voltages applied to FIG. 7a in an exemplary embodiment of the preset invention. In this example, word line $WL_C$ corresponds to a selected word line and word lines $WL_A$ and $WL_B$ correspond to non-selected word lines. Waveform 131 is the voltage level controlling the connection of the non-selected word lines to line 107, waveform 135 is the voltage level controlling the connection of any selected word lines, and 137 is the level on line 107 itself.

In a first phase, from $t_0$ to $t_1$ in FIG. 7b, transistors 101, 103, and 105 are all turned on by supplying $V_{pp}$ to lines 111, 113, and 115, and the erase voltage $V_{erase}$ is concurrently supplied at $V_E$. The result of this erase initialization phase is to set the well and the word lines running across it, both selected and non-selected, to $V_{erase}$. The duration of this phase, ($t_1$-$t_0$), can either be hardwired into the system or, preferably, adjustable, either at test time or dynamically in response to operating conditions or device characteristics. For example, a parameter based implementation could be used with the parameter set when the device is subjected to its initial tests.

The erase phase (or initial erase phase) takes place between times $t_1$ and $t_2$, where the duration here can be determined similarly to that for the initialization phase. Additionally, the corresponding parameter can be dynamically altered based on failure of erase verify or other erase related errors. In this phase, $V_A$ and $V_B$ are taken low, shutting off transistors 101 and 103 and trapping the erase voltage on non-selected word lines $WL_A$ and $WL_B$. The erase voltage is also held on the well, in this exemplary embodiment by the diode 121 and more generally by the c-p-well control circuit 5. During the erase process, the other terminals of the memory can be treated as discussed above with respect to FIG. 6; namely, the bit lines (BL), select lines (SG) and c-source can be put in a floating state, where they are raised to almost $V_{erase}$ due to a capacitive coupling with the c-p-well and the non-selected word lines. In a various of the present invention, any of these could also be supplied directly with $V_{erase}$ in a manner similar to that described for the non-selected word lines.

In another aspect of the present invention, the erase voltage on the well, the non-selected word lines, or both can be refreshed. FIG. 7b shows this as occurring after time $t_2$. The voltage $V_E$ is again taken to $V_{erase}$ and, to prevent selected word lines from charging back up, $V_C$ is set low to turn off transistor 105. To recharge the non-selected word lines, $V_A$ and $V_B$ are taken high, allowing $V_{erase}$ back onto $WL_A$ and $WL_B$ through respective transistors 101 and 103. The c-p-well 11 is also concurrently recharged through diode 121. Subsequently, $V_A$, $V_B$, and $V_E$ are all taken low and $V_C$ is taken high and the erasing of the selected storage elements continues. This refreshing process can be repeated one or more times as needed.

Although FIG. 7b shows the well 11 and non-selected word lines $WL_A$ and $WL_B$ both being included in the refresh process, it may not be necessary to do both in some devices. For example, $V_A$ and $V_B$ could be kept low and only the well would be refreshed or, alternatively, the non-selected word lines could be refreshed, but not the well. (This last variation would require replacing the diode 121 with a transistor or other switch in c-p-well control 5.) Also, for exemplary purposes, the waveforms 131, 135, and 137 show the duration of the refresh intervals (when 137 is high after $t_2$) to be roughly the same the duration as the subsequent erase intervals (when 137 is low after $t_2$) and the initialization phase ($t_1$-$t_0$). In practice, it is likely than the refresh intervals will be shorter than the initialization phase, since the voltage level is just being "topped off", and shorter than the subsequently erase phases, which may be closer to the initial erase phase ($t_2$-$t_1$) in duration. As with the other timing values, the magnitude of these various durations can be set in hardware, software, or firmware and preferable use a parameter based implementation that can be set at test time or varied dynamically in response to operation conditions or device characteristics. Additionally, the corresponding parameters can be dynamically altered based on failure of erase verify or other erase related errors.

As noted above, representative word lines $WL_A$, $WL_B$, and $WL_C$ can correspond to the word lines of the same block in FIG. 2 or may be from different blocks. Although the use of the techniques described with respect to FIGS. 7a and 7b can be advantageously used for individual word lines within a single block, such as WL0_i, WL1_i and WL2_i in FIG. 2, where only WL2_i has been selected for erase FIG. 2, it will more commonly be used where $WL_A$, $WL_B$, and $WL_C$ correspond to word lines from different blocks.

Returning to the exemplary embodiment described above with respect to FIGS. 1-5 and developed further in previously incorporated U.S. Pat. Nos. 6,522,580 and 6,373,746, a block corresponds to the memories unit of erase. Typically, many (up to several hundred) blocks may be formed upon a single well and each block will have a number of word lines. Generally, the unit of erase, or block, will differ from the units of writing, or page, and reading, with a block typically including a number of pages (which may, in turn, include one or more sectors, the traditional unit of data transfer). Thus, the erase process will typically not consist of the erase of a single pages, but of all of the pages within a (physical) block. Within this structure, each of the word lines $WL_A$, $WL_B$, and $WL_C$ would represent the collective set of word lines in a particular block. As described in the cited references, for a exemplary embodiment the input lines for the control gates can be applied to all blocks in the memory, with a block select signal determining which word lines in which blocks actually receive the signals.

For example, with reference to FIGS. 1-3, the row control circuits 3 (along with state machine 8 and command circuits 7) decodes the input lines on the memory device 22 and applies these to all of the blocks of memory array 1. For example, in a read process, only one of these input lines is held at the read voltage, will the non-selected ones are turned fully on; similarly, when programming, only one of the input lines at held at the program voltage, with the rest at a pass voltage. To the restrict the read or write operation to a particular block, only that one block of the, here, 1024 blocks is selected, thereby allowing the input voltages to actually pass to the word lines.

More detail on suitable circuitry which can be adapted to the present invention is given in the incorporated U.S. Pat. No. 6,373,746 for the case of 16 word lines per block and where the signals CG1-CG16 are the input voltages. FIG. 17 of U.S. Pat. No. 6,373,746 describes a block decoding circuit in which, for a given block, the signal Transfer G1 corresponds to $V_A$, $V_B$, $V_C$ of FIG. 7 here. In the prior, as shown here in FIG. 6, when a particular block i is selected for erase, this signal is high for the selected block and low for the non-selected blocks. The word lines WL1_i-WL16_i are all grounded and the memory devices in that block are erased. As the other blocks are left floating and, due to the capacitive coupling, are raised towards the substrate voltage, relatively little voltage difference is placed across the non-selected memory cells. (The passing or not passing of CG1-CG16 to the word lines occurs via the polarity of RDECAD as derived from FIG. 16 of U.S. Pat. No. 6,373,746. For the selected block this signal is high, for all the unselected blocks this signal is low. Then VRDEC is put to VPP and Transfer G1 is pumped higher than VPP (either on the memory device itself or imported from another device) and these values are applied as shown here in FIG. 6, for the prior art, and in FIGS. 7a and 7b for the present invention.)

As described above, a main aspect of the present invention is to find an alternative to floating the word lines of all blocks not selected for erase, with the resulting residual potential left across the memory unit, without increasing the size of the memory device, or die, itself. The present invention allows the prior art memory structure, as described in the incorporated references, to be largely maintained without requiring completely new circuits in the "pitch" portions of the word line layout, by just change their control signals which are generated at one place on the memory device. Again referring to FIGS. 16 and 17 of U.S. Pat. No. 6,373,746, this can be implemented by first raising CG1-CG16 all to Vpp, VRDEC to Vpp, pump Transfer G1 above Vpp at the same time as the p-well of the memory array is taken to Vpp. The decoding (inputs to FIG. 16) then needs to be altered (with respect to U.S. Pat. No. 6,373,746) to de-select any blocks, which has the effect of putting Vpp on all word lines. Transfer G1 is deselected so that all word lines are floating (but pre-charged to Vpp), then the proper decoding signals are applied while moving CG1-CG16 all to ground. This has the effect of placing ground on all 16 word lines of the selected block only, and causes that block to be erased. As shown here in FIG. 7b, this cycle can be repeated multiple times if it is desired to refresh the floating word lines held at Vpp.

The present invention has a number of advantages over the prior, some of which have already been discussed above. These include less potential erase-induced disturb in non-selected storage elements and a tighter erase distribution in the selected elements. These features are increasingly important as the scale of multi-state non-volatile memory devices continues to decrease, since this scaling typically results in products in which erase inhibit voltage depends strongly on close tracking of coupling ratios. Another aspect of the present invention is that this can be accomplished without increasing the pitch area of the circuit or adding new wires in the memory array. As described above, the various aspects of the present invention can be implemented by introducing minimal additional peripheral area.

As noted above, the present invention is applicable not just to the NAND type of flash memory of the exemplary embodiment, but other cases where the storage elements are formed upon a well structure and a process requires a high potential difference to be placed across selected elements. In particular, other EEPROM or charge storing cells could benefit, e.g. a NOR type flash memory with well erase. It can similarly be extended to where the storage element is not a floating gate transistor, for example the dielectric storage element of the kind described in the U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference.

Although the various aspects of the present invention have been described with respect to specific embodiments, it will be understood that the invention is protected within the full scope of the appended claims.

It is claimed:

1. In a non-volatile memory comprising a plurality of storage units arranged into a plurality of rows formed upon a substrate, a plurality of word-lines each connecting to control gates of the storage elements of a respective row and a well structure in the substrate upon which the storage units are formed, a method comprising:

concurrently setting the voltage level of the well structure and the word-lines to an erase voltage; and subsequently allowing the word-lines connected to selected ones of the storage elements to discharge the erase voltage while maintaining the erase voltage on the well structure and the word-lines connected to the non-selected ones of the storage elements.

2. The method of claim 1, wherein the storage units form part of an array having a NAND architecture.

3. The method of claim 1, wherein said allowing the word-lines connected to the selected ones of the storage elements to discharge the erase voltage comprises connecting the word-lines connected to the selected ones of the storage elements to ground.

4. The method of claim 1, wherein said maintaining the erase voltage on the word-lines connected to the non-selected ones of the storage elements comprises trapping charge on the on the word-lines connected to the non-selected ones of the storage elements.

5. The method of claim 1, wherein said maintaining the erase voltage on the well structure comprises refreshing the charge level trapped on the well structure.

6. The method of claim 5, wherein said maintaining the erase voltage on the word-lines connected to the non-selected ones of the storage elements comprises refreshing the charge level trapped on the word-lines connected to the non-selected ones of the storage elements concurrently with refreshing the charge level trapped on the well structure.

7. The method of claim 1, wherein said maintaining the erase voltage on the word-lines connected to the non-selected ones of the storage elements comprises refreshing the charge level trapped on the word-lines connected to the non-selected ones of the storage elements.

8. The method of claim 1, wherein the non-volatile memory is physically organized into a plurality of erase units each consisting of a plurality of said word-lines, the method further comprising:

selecting the word-lines of a given unit of erase for erase as a group.

9. The method of claim 1, wherein the storage units are multi-state storage units.

10. The method of claim 9, wherein the memory is a flash memory.

11. The method of claim 1, further comprising:

receiving the erase voltage from external to the memory.

* * * * *